US005560857A

United States Patent [19]

Sakon et al.

[11] Patent Number: 5,560,857
[45] Date of Patent: Oct. 1, 1996

[54] SOLUTION FOR CLEANING SILICON SEMICONDUCTORS AND SILICON OXIDES

[75] Inventors: Tadashi Sakon, Kawasaki; Kenichi Uemura, Sagamihara; Yoshihiro Mori, Sagamihara; Kengo Shimanoe, Sagamihara; Susumu Ohtsuka, Sagamihara; Shuji Munehira, Tokyo, all of Japan

[73] Assignees: Nippon Steel Corporation; NSC Electron Corporation, both of Tokyo, Japan

[21] Appl. No.: 320,220

[22] Filed: Oct. 11, 1994

[30]     Foreign Application Priority Data

Oct. 19, 1993  [JP]  Japan ................... 5-283845

[51] Int. Cl.$^6$ ................... C09K 13/00; H01L 21/00
[52] U.S. Cl. ................... 510/175; 252/79.3; 134/3; 156/662.1; 510/375
[58] Field of Search ................... 156/662.1, 657.1; 252/79.3, 101, 100, 142; 134/1-3

[56]           References Cited

U.S. PATENT DOCUMENTS 4,171,242  10/1979  Liu .............................. 156/657

FOREIGN PATENT DOCUMENTS

| 0477504 | 4/1992 | European Pat. Off. . |
| 0501492 | 9/1992 | European Pat. Off. . |
| 22881 | 2/1977 | Japan . |
| 228327 | 10/1991 | Japan . |
| 4811 | 1/1993 | Japan . |

OTHER PUBLICATIONS

IEEE Transactions On Semiconductor Manufacturing, vol. 5, No. 2, May, 1992, pp. 114–120, XP 000360141 Itano et al., Particle Deposition and Removal in Wet Cleaning Processes for ULSI Manufacturing.

Extended Abstracts, vol. 87, No. 1, 1887 Princeton New Jersey, US, pp. 381–382, Lampert, Influences of the Cleaning Method On the Chemical Behavior of Hydrophilic Silicon Surfaces.

Journal of Electrochemical Society, vol. 139, No. 6, Jun., 1992, pp. 1751–1756, XP 000324426 Anttila et al., Metal Contamination Removal On Silicon Wafers Using Dilute Acidic Solutions.

IEEE Transactions On Semiconductor Manufacturing, vol. 6, No. 3, Aug., 1993, pp. 258–267, XP 000399828 Itano et al., Particle Removal From Silicon Wafer Surface In Wet Cleaning Process.

Kem, et al, "Cleaning Solutions Based on Hydrogen Peroxide for use in Silicon Semiconductor Technology", RCA Review, Jun. 1970, pp. 187–205.

*Primary Examiner*—Thi Dang
*Attorney, Agent, or Firm*—Pollock, Vande Sande & Priddy

[57]           ABSTRACT

A cleaning solution for achieving highly accurate cleaning of silicon semiconductors and silicon oxides. The solution which enables a great reduction in the metal contaminants and the number of fine particles adhered on the surfaces and retention of the hydrophilic property of the surfaces to prevent the surfaces from being unstable, comprising an aqueous acidic solution containing 0.005% by weight or more to less than 0.05% by weight hydrogen fluoride and 0.3% by weight or more to 20.0% by weight or less hydrogen peroxide and having a pH in the range from 1 or more to less than 5.

3 Claims, No Drawings

SOLUTION FOR CLEANING SILICON SEMICONDUCTORS AND SILICON OXIDES

BACKGROUND OF THE INVENTION

1. Field of the Invention

The present invention relates to a solution for cleaning silicon semiconductors and silicon oxides.

2. Description of the Related Art

In the course of production of semiconductor devices, semiconductor wafers and glass wafers are produced, cleaning steps are conducted before various stages.

The cleaning of those wafers, for example, silicon wafers, is performed by a so-called SC-1 cleaning process using primarily a mixture of an aqueous solution of hydrogen peroxide/ammonia water/pure water to remove organic materials and deposited fine particles.

However, such cleaning solution may inevitably cause contamination with Fe, Zn and Al which are trace metal contaminants in the solution. For this reason, all the wafers, from which metal contaminants must be removed, are cleaned by the SC-1 cleaning process, followed by cleaning with acidic solution.

Acidic solution for cleaning may advantageously remove metal contaminants on the surfaces of wafers, but disadvantageously cause adhesion of fine particles contained in the solution onto the wafers in the course of cleaning. Therefore, there has been sought in the semiconductor device and silicon wafer industry a technique capable of cleaning wafers having less contamination with fine particles, if any. Similar circumstances have been prevailing in the field of techniques for cleaning silicon oxides such as quartz glass wafers.

There have been known conventional practical methods related to the cleaning with various acids such as (1) an acidic solution solution containing hydrofluoric acid, sulfuric acid and hydrogen peroxide in water as disclosed in Japanese Patent KOKAI (Laid-open) No. Sho 58-30135, (2) a combination of a mixture of ammonia and hydrogen peroxide in water with a mixture of hydrochloric acid and hydrogen peroxide in water as disclosed in Japanese Patent KOKAI No. Hei 2-100320, (3) an acidic solution containing hydrochloric acid and hydrogen peroxide as disclosed in Japanese Patent KOKAI No. Hei 3-273629, (4) a combination of the cleaning with an aqueous solution of hydrofluoric acid, followed by treatment with hydrogen peroxide as disclosed in Japanese Patent KOKAI No. Hei 4-177725, (5) a solution of strong acid and a very small amount of a compound containing fluorine as disclosed in Japanese Patent KOKAI No. Hei 4-234118, and (6) a solution containing 0.5% hydrofluoric acid and 0.1 to 1% hydrogen peroxide, with which cleaning is conducted at room temperature, as disclosed in, for example, "TRYBOROZIST" Vol. 37, No. 3, (1992) pp. 218–224.

The cleaning solution of the above items (1), (5) and (6) may appear at first sight identical to, but it is definitely different from the solution of the present invention.

The cleaning solution of the above item (1) is for performing degreasing treatment, heavy metals-removing treatment and etching treatment (for removal of residual stress in a ground layer) at the same time, but not for the purpose of inhibiting the adhesion of fine particles during cleaning, which is different in object and industrial utilization from the cleaning solution of the present invention.

The etching depth with the cleaning solution of the invention (1) is of the order of micrometers as shown in Figure accompanied with its specification, while the etching depth achieved by using the cleaning solution of the present invention is of the order of Angstroms.

For example, Examples 22 and 23 shown in Table 1 in the present specification were evaluated for the etching speed to result in about 0.35 Angstrom/min.

The invention (1) does not describe in claims about the composition of the cleaning solution, but refers to a "proportion of HF to be mixed" in the range of about 1.5% or less in its specification, and shows in Figure that "the depth of etching semiconductor wafers" becomes zero in the vicinity of a proportion of HF to be mixed of 0.1%.

It is considered from the foregoing that the "proportion of HF to be mixed" ranges from 0.1 to 1.5% and that the concentration of hydrofluoric acid is definitely different to an extent of orders of magnitude from that of the cleaning solution of the present invention.

The process of the invention (1) comprises "cleaning with a solution containing hydrofluoric acid, sulfuric acid and hydrogen peroxide in water" according to the disclosure of its specification and the "proportion of HF to be mixed" is 1.5% or less as pointed out above, so that the concentrations of sulfuric acid and/or hydrogen peroxide in the cleaning solution must be extremely high. Therefore, the cleaning solution of the invention (1) is different in this point from that of the present invention.

The cleaning solution of the invention (5) comprises primarily a concentrated acid and Table 1 in Example shows typical compositions of cleaning solution where the concentration of sulfuric acid is 88.9% by weight in all cases.

In contrast, the cleaning solution of the present invention comprises primarily water as can be seen from claims and Examples.

The method of the invention (5) describes in paragraph 11 of the specification that a key point of the invention lies in no oxide film observed on the surfaces of the cleaned wafers, which surfaces have been made chemophobic, and in fact all the surfaces of cleaned wafers shown in Table 2 of Example of the invention (5) were made chemophobic.

In contrast, the cleaning solution of the present invention does not impair the hydrophilic property of the surfaces even after cleaning. Therefore, the invention (5) is different from the present invention.

The cleaning solution of the invention (6) and that of the present invention are the same in the point of containing hydrofluoric acid and hydrogen peroxide, but different apparently from each other in the concentration of hydrofluoric acid.

As shown in Table 1 of the present specification, Comparative Examples 58 to 60 indicate that when the silicon wafers made previously hydrophilic by the SC-1 cleaning (APM cleaning) are cleaned with the cleaning solution of the invention (6) containing 0.25% to 0.50% hydrogen fluoride+1% hydrogen peroxide and rinsed with pure water, the surfaces are converted to be hydrophobic with an increase in the number of fine particles adhered after cleaning.

Therefore, the cleaning solution of the invention (6) is completely different from that of the present invention.

As described above, there has been sought a technique for cleaning wafers which is capable of removing metal contaminants with minimum adhesion of fine particles in the production of semiconductor devices, semiconductor wafers and glass wafers.

Industrial development tends to require an increasingly severer level of an reduction in the amounts of metal contaminants and adhered particles to be achieved, which target level becomes difficult to achieve by conventional cleaning techniques.

SUMMARY OF THE INVENTION

In view of the aforementioned circumstances, an object of the present invention is to provide a novel high performance solution for cleaning silicon semiconductors and silicon oxides which is capable of reducing drastically the level of metal contaminants on the surfaces of wafers and the number of adhered particles as well as retaining the hydrophilic property of the surfaces of wafers to prevent the surfaces from becoming unstable.

Another object of the present invention is to provide a cleaning solution comprising an aqueous acidic solution containing 0.005% by weight or more to less than 0.05% by weight hydrogen fluoride and 0.3% by weight or more to 20.0% by weight or less hydrogen peroxide and having a pH in the range from 1 or more to less than 5.

Still another object of the present invention is to provide the aqueous acidic solution which contains at least one selected from acids, salts and bases in addition to said hydrogen fluoride and said hydrogen peroxide.

DETAILED DESCRIPTION OF PREFERRED EMBODIMENTS

The cleaning solution of the present invention comprises an aqueous solution containing 0.005% by weight or more to less than 0.05% by weight hydrogen fluoride, 0.3% by weight or more to 20.0% by weight or less hydrogen peroxide having a pH of one or more to less than 5. The cleaning solution enables a reduction in the amount of metal contaminants on the surfaces of silicon semiconductors and silicon oxides cleaned therewith and a great reduction in the adhesion of particles, which have been produced during cleaning in the solution, onto the surfaces without impairing the hydrophilic property of the surfaces even after cleaning when the silicon semiconductors and silicon oxides have hydrophilic oxide film on the surfaces thereof.

The aforementioned aqueous acidic solution may contain, in addition of the hydrogen fluoride and hydrogen peroxide, at least one of acids, salts and bases. The acids may be selected from the group consisting of phosphoric acid, sulfuric acid, nitric acid, trichloroacetic acid, dichloroacetic acid, hydrochloric acid, monochloroacetic acid, and acetic acid. The salts may be selected from the group consisting of ammonium salts and amine salts. The bases may be selected from the group consisting of ammonia and amines.

As clearly can be seen from Examples in Table 1, the cleaning solution according to the present invention allows production of extremely clean silicon semiconductors and silicon oxides having minimum amounts of metal contaminants and fine particles adhered on the surfaces thereof by cleaning them with the solution without impairing the hydrophilic property of the surfaces cleaned.

Moreover, the cleaning solution of the present invention does not cause any haze on the silicon wafers cleaned with the solution at all.

The cleaning solution of the present invention are suitable for cleaning silicon semiconductor wafers and glass wafers and they can be used to any form without losing their characteristics due to the form to be cleaned.

A step using the cleaning solution of the present invention may be performed in combination with other cleaning steps. As shown in Example, for example, the so-called SC-1 cleaning (APM cleaning) using an alkaline water solution comprising a mixture of an aqueous solution of hydrogen peroxide/ammonia water/pure water may be conducted as precleaning. Alternatively, precleaning with an aqueous solution of hydrofluoric acid may be conducted.

When the cleaning is performed using the cleaning solution of the present invention, preferably articles to be cleaned should be completely immersed in the cleaning solution to avoid uneven cleaning.

The characteristics of the cleaning solution of the present invention are not impaired even when the articles to be cleaned in the course of cleaning by ultrasonic wave and the like.

Preferably the cleaning temperature should be in the range of 50° to 90° C. The cleaning time should preferably be in the range of several minutes to 30 minutes.

It would be apparent for those skilled in the industrial field related to the present invention that cleaning conditions cannot generally be determined because they are influenced by a number of factors such as cleanliness of articles to be cleaned and properties of the surfaces, production cost, throughput and the like.

The cleaning of silicon wafers with the cleaning solution of the present invention does not cause an increase in roughness of the surfaces, nor side effects such as a reduction in electric breakdown strength of thermal oxide films.

The reasons why the concentration of hydrogen fluoride in the cleaning solution of the present invention is defined in the range from 0.005% by weight or more to less than 0.05% by weight are as follows:

A content of hydrogen fluoride less than 0.005% by weight may result in a reduced recombination life time, i.e., a reduction in the ability of removing metal contaminants on the surfaces with the number of fine particles adhered being somewhat increased as can be seen from Comparative Example 53 in Table 1.

A content of hydrogen fluoride higher than 0.05% by weight may make the surfaces of the cleaned silicon wafers hydrophobic with the number of fine particles adhered being greatly increased after cleaning as can be seen from Comparative Examples 48 and 49 in Table 1.

Such increase in the number of fine particles adhered may be suppressed to a certain degree by lowering the cleaning temperature as can be seen from Comparative Examples 58 to 60 in Table 1, but the resultant number still remains considerably higher than that achieved with the cleaning solution of the present invention. Moreover, after cleaning, the surfaces of the silicon wafers are hydrophobic.

Therefore, in order to achieve a reduction in the amount of metal contaminants on the surfaces of the cleaned articles as well as a great reduction in the adhesion of floating fine particles produced during cleaning in the solution onto the surfaces without impairing the hydrophilic property of the cleaned surfaces, the content of hydrogen fluoride should be in the range from 0.005% by weight or more to less than 0.05% by weight.

From the foregoing, the concentration of hydrogen fluoride in the cleaning solution of the present invention is defined to be in the range from 0.005% by weight or more to less than 0.05% by weight.

The reasons why the concentration of hydrogen peroxide in the cleaning solution of the present invention are defined to be in the range from 0.3% by weight or more to 20% by weight or less are as follows:

A content of hydrogen peroxide of less than 0.3% by weight may render the surfaces of silicon wafers hydrophobic after cleaned with an increase in the number of fine particles after cleaning as can be seen from Comparative Examples 51 and 52 in Table 1.

Widen the content of hydrogen peroxide is more than 0.3% by weight, the amount of metal contaminants on the surfaces of the cleaned articles is reduced, the adhesion of floating fine particles produced during cleaning in the solution is extremely reduced, and the hydrophilic property of the surfaces is not impaired even after cleaned as can be seen from Examples in Table 1.

Comparative Example 50 indicates that the characteristics of the cleaning solution of the present invention may be retained even at a content of hydrogen peroxide in excess of 20% by weight. However, such high content of hydrogen peroxide is not only disadvantageous in cost, but also undesirable from a safety viewpoint because of evolution of oxygen gas through decomposition of hydrogen peroxide.

From the foregoing, the concentration of hydrogen peroxide in the cleaning solution of the present invention are defined to be in the range from 0.3% by weight or more to 20% by weight or less.

The reasons why the pH of the cleaning solution of the present invention is defined to be in the range from one or more to less than 5 are as follows:

If the pH is less than 1, the number of fine particles adhered after cleaned is greatly increased even at concentrations of hydrogen fluoride and hydrogen peroxide in the ranges defined for the cleaning solution of the present invention. This can be seen from Comparative Example 61 in Table 1.

If the pH is not less than 5, the recombination life time is reduced and the ability of removing metal contaminants on the surfaces is declined as illustrated by Comparative Example 62 shown in Table 1.

Therefore, in order to decrease the amount of metal contaminants on the surfaces of the cleaned articles and to markedly reduce the adhesion of floating fine particles produced during cleaning in the solution onto the surfaces without impairing the hydrophilic property of the surfaces even by cleaning, the range of pH should be from one or more to less than 5.

From the foregoing, the pH of the cleaning solution of the present invention is defined to be in the range from one or more to less than 5.

The cleaning solution of the present invention may contain, in addition of the hydrogen fluoride and hydrogen peroxide, at least one of acids, salts and bases. The acids may be selected from the group consisting of phosphoric acid, sulfuric acid, nitric acid, trichloroacetic acid, dichloroacetic acid, hydrochloric acid, monochloroacetic acid, and acetic acid. The salts may be selected from the group consisting of ammonium salts and amine salts. The bases may be selected from the group consisting of ammonia and amines.

Table 1 shows Examples where phosphoric acid, sulfuric acid, nitric acid, trichloroacetic acid, dichloroacetic acid, hydrochloric acid, monochloroacetic acid, acetic acid, ammonium fluoride, ammonium chloride, ammonium nitrate, choline chloride, ammonia and choline were used as additives.

In any case, it is apparent that the amount of metal contaminants on the surfaces of cleaned articles can be decreased and the adhesion of floating fine particles produced in the course of cleaning in the solution onto the surfaces can be greatly reduced without impairing the hydrophilic property of the surfaces cleaned.

As described above, the addition of a wide variety of acids, salts and bases does not diminish the characteristics of the cleaning solutions of the present invention, which indicates clearly that the acids, salts and bases to be added into the cleaning solution of the present invention are not limited to those illustrated in Examples.

Mechanism which allows the cleaning solution of the present invention to exhibit their characteristics has been not understood, though the cleaning solution of the present invention are different from those of the prior art in the following points:

Japanese Patent KOKAI (Laid-open) No. Hei 3-273629 describes the characteristics of a solution containing hydrochloric acid and hydrogen peroxide, and FIG. 1 thereof shows that "the amount of particle adhered (the number of fine particles to be adhered after cleaning)" begins to increase at a pH of 5 or less, markedly at a pH of 3 or less.

in contrast, the cleaning solution of the present invention produces less number of fine particles adhered after cleaning even at a pH in the range from 1 to 3 as shown in Example 32 in Table 1.

Japanese Patent KOKAI No. Hei 3-273629 teaches in FIG. 2 that the increase in cleaning temperature causes an increase in "the amount of particles adhered", markedly at 60° C. or higher.

In this regard, the Table 1 shows Comparative Examples 54 to 57 using identical cleaning solution to those described in Japanese Patent KOKAI No. Hei 3-273629 where the number of fine particles to be adhered onto the surfaces after cleaning was 170/cm$^2$ or more.

In contrast, the cleaning solution of the present invention produces drastically reduced number of fine particles to be adhered from those floated in the solution onto the surfaces even at a cleaning temperature of 60° C. or higher as illustrated in Examples 19, 20, 26 and 27 shown in Table 1.

It is apparent from the foregoing that the cleaning solution of the present invention is different from those of the prior art.

EXAMPLES

The present invention is further described with reference to Examples, but it is not intended to limit the scope of the present invention thereto.

First, a procedure for evaluating the ability of removing metal contaminants on the surfaces will be described.

Fresh silicon wafers and glass wafers were immersed in a mixture of a water containing 28% ammonia, a water containing 30% hydrogen peroxide and pure water mixed in a volume ratio of 1:1:5 at 70° C. for 5 minutes.

The wafers removed from the immersion were rinsed in pure water for 5 minutes, and after the surfaces were confirmed to be hydrophilic, the wafers were dried by a spin dryer.

This procedure will be referred to as APM cleaning hereinafter. The APM cleaning may cause adhesion of heavy metal impurities in the cleaning solution onto the surfaces of wafers in the course of cleaning resulting in contaminated surfaces.

Only Examples 24 and 25 shown in Table 1 were subjected to the APM cleaning, then immersed in an aqueous 1 hydrogen fluoride solution for one minute to remove the surface oxide film, rinsed in pure water for 2 minutes and dried by a spin dryer. This procedure will be referred to as DHF cleaning hereinafter.

Next, the silicon wafers or glass wafers were cleaned immersing in the cleaning solution of the present invention under the conditions indicated in Table 1 (without containing any polystyrene latex fine particles).

After the wafers were rinsed in pure water for two minutes and determined to have hydrophilic or hydrophobic surfaces, they were dried by a spin dryer. Evaluation of the amount of metal contaminants on the surfaces after cleaned were made in two ways, one of which was by the value of recombination carrier life time. The higher the value, the higher the purity, and the less the amount of metal contaminants on the surfaces.

In the procedure, the wafers cleaned with the cleaning solution of the present invention and dried were oxidized at a high temperature of 1000° C. in an atmosphere of dry oxygen for 70 minutes to produce an oxide film of about 500 Angstroms, cooled to room temperature, and then evaluated for the recombination carrier life time by a microwave reflective life time measuring apparatus (photoconductive decay method).

Another method for evaluation of the amount of metal contaminants on the surfaces after cleaned used an atomic absorption spctrometry. The contaminant metals on the surfaces of wafers were recovered with a mixture of hydrofluoride acid and nitric acid and the concentration of the metals in the recovered solution was quantitatively determined by the atomic absorption spectrometry to convert into a surface contaminant concentration. The lower quantitative limit of this method is about $8 \times 10^9$ atoms/cm$^2$.

The adhesion of fine particles onto the surfaces from those floating in the solution was evaluated by the following procedure. After fresh wafers were cleaned with APM (only Examples 24 and 25 in the Table 1 were cleaned with APM and then with DHF), the silicon wafers or glass wafers were immersed in the cleaning solution of the present invention to be cleaned under the conditions stated in Table 1.

In the cleaning solution of the present invention, polystyrene latex fine particles having a diameter of 0.352 μm, were predispersed in a concentration of $1.5 \times 10^5$/liter.

After cleaning, the wafers were rinsed for two minutes and dried by a spin dryer. Evaluation of fine particles adhered on the wafers was made by using an instrument of measuring fine particles (light scattering method) to determine the number of fine particles adhered having a diameter more than 0.33 μm which was converted into a value per unit area.

Examples 05 and 06 in Table 1 were evaluated by conducting examination under the illumination from a condenser. (The wafers were examined by the naked eye under irradiation with an intense light in a dark room. The existence of adhered fine particles, if any, can be determined owing to scattering of the light.)

Table 1 summarizes the results of the evaluations on the number of fine particles adhered after cleaning with the cleaning solution of the present invention, the recombination carrier life time and the atomic absorption spectrometry (Numbers 01 to 47).

The results of the Comparative Examples where the cleaning solution differs from those of the present invention in the concentration of hydrogen fluoride, the concentration of hydrogen peroxide, and the level of pH as well as having no hydrogen fluoride, were used to effect cleaning, followed by rinsing, are also given in Table 1 (Numbers 48 to 62).

The cleaning procedure and the evaluation procedure were the same as those employed in the present invention.

The cleaning solution of the present invention resulted in a reduced amount of metal contaminants on the surfaces of the silicon semiconductors and silicon oxides after cleaned, a great reduction in the adhesion of fine particles which have been produced and floating in the solutions in the course of cleaning, and no loss of the hydrophilic property of the surfaces of the silicon semiconductors and silicon oxides, which have been hydrophilic owing to the surface oxide film, even after they are cleaned.

In contrast, the cleaning solution of the comparative examples may result in insufficient reduction in the amount of metal contaminants after cleaning, an increase in the number of fine particles adhered from those produced during cleaning and floating in the solutions onto the surfaces, and a loss of the hydrophilic property of the surfaces of the cleaned articles. Therefore, they can not be used for the purpose of the present invention.

Comparative Example 50 where the concentration of hydrogen peroxide was exceeding the range of the present invention had exceptionally an identical performance to that of the cleaning solution of the present invention.

in all of the examples of the present invention and the comparative Examples, no haze occurred under the conditions indicated in Table 1.

TABLE 1

| Example No. of Present Invention | Composition of cleaning solution | | | | Cleaning conditions | | | | Surface condition*3) | | Contaminants after cleaning | | Number of adhered fine particles |
|---|---|---|---|---|---|---|---|---|---|---|---|---|---|
| | HF wt. % | H$_2$O$_2$ wt. % | Other additives*1) mol/liter | pH | Cleaned wafer*2) | Temperature °C. | Time (min.) | | Before | After | AAS*4) | Life time*5) | per squ. centimeter*6) |
| 01 | 0.048 | 10.0 | B: 0.005 | 2.0 | V(N) | 80 | 5 | | Hydrophilic | Hydrophilic | **** | 1283 | 0.1 |
| 02 | " | " | C: 0.0063 | 2.1 | " | " | " | | " | " | **** | 1342 | 0.0 |
| 03 | " | " | D: 0.01 | 1.9 | " | " | " | | " | " | **** | 1290 | " |
| 04 | 0.045 | 15.0 | None | 2.4 | " | 70 | " | | " | " | **** | 1336 | " |
| 05 | " | 8.0 | None | " | Y | 80 | 3 | | " | " | ND | **** | None*7) |
| 06 | " | " | None | " | " | 60 | 5 | | " | " | ND | **** | None*7) |
| 07 | 0.040 | " | E: 0.01 | 2.0 | V(N) | 80 | " | | " | " | **** | 1306 | 0.0 |
| 08 | 0.030 | " | None | 2.5 | " | " | " | | " | " | **** | 1333 | 0.1 |
| 09 | " | " | M: 0.005 | 3.0 | " | " | " | | " | " | **** | 1352 | 0.0 |
| 10 | " | " | N: 0.005 | 3.1 | " | " | " | | " | " | **** | 1299 | " |
| 11 | " | " | M: 0.005, F: 0.003 | 2.7 | " | " | " | | " | " | **** | 1330 | " |
| 12 | " | " | M: 0.005, I: 0.003 | 3.5 | " | " | " | | " | " | **** | 1251 | " |
| 13 | " | 3.0 | A: 0.01 | 2.4 | " | " | " | | " | " | **** | 1220 | 0.1 |
| 14 | " | 3.0 | J: 0.01 | 2.5 | " | " | " | | " | " | **** | 1299 | 0.0 |
| 15 | 0.020 | 3.0 | C: 0.01 | 2.0 | " | " | " | | " | " | **** | 1337 | 1.0 |
| 16 | 0.030 | 3.0 | K: 0.01 | 2.5 | " | " | " | | " | " | **** | 1314 | 0.1 |
| 17 | 0.030 | 3.0 | L: 0.005 | 2.5 | " | " | " | | " | " | **** | 1292 | 0.3 |
| 18 | 0.020 | 6.0 | None | 2.6 | V(N) | 80 | 5 | | Hydrophilic | Hydrophilic | **** | 1355 | 0.2 |
| 19 | " | " | None | " | " | 85 | " | | " | " | **** | 1266 | 0.4 |
| 20 | " | " | None | " | " | 80 | " | | " | " | **** | 529 | 0.2 |
| 21 | " | " | None | " | V(P) | " | 10 | | " | " | ND | **** | 0.1 |
| 22 | " | " | None | " | X(N) | " | 5 | | " | " | ND | **** | 0.3 |
| 23 | " | " | None | " | X(P) | " | " | | " | " | ND | **** | 0.0 |
| 24 | " | " | None | " | W(N) | 70 | " | | Hydrophobic | " | **** | 1288 | 0.0 |
| 25 | " | " | None | " | W(P) | " | " | | " | " | **** | 540 | 0.1 |
| 26 | " | " | None | " | V(N) | 60 | " | | Hydrophilic | " | **** | 1312 | 0.0 |
| 27 | " | " | None | " | " | 80 | " | | " | " | **** | 1290 | " |
| 28 | " | 3.0 | None | " | " | " | " | | " | " | **** | 1317 | " |
| 29 | " | 1.0 | None | " | " | " | " | | " | " | **** | 1301 | 0.2 |
| 30 | " | 0.5 | None | " | " | " | " | | " | " | **** | 1288 | " |
| 31 | " | 0.3 | None | " | " | " | 10 | | " | " | **** | 1267 | 0.0 |
| 32 | " | 6.0 | F: 0.03 | 1.5 | " | 60 | 5 | | " | " | **** | 1342 | 1.9 |
| 33 | " | " | F: 0.01 | 2.0 | " | 80 | 5 | | " | " | **** | 1366 | 1.2 |
| 34 | 0.020 | 6.0 | F: 0.005, C: 0.005 | 2.0 | V(N) | 60 | 7 | | Hydrophilic | Hydrophilic | **** | 1279 | 0.5 |
| 35 | " | " | F: 0.01, I: 0.003, M: 0.01 | 2.8 | " | 80 | 5 | | " | " | **** | 1353 | 0.0 |
| 36 | " | 3.0 | G: 0.01 | 2.4 | " | " | " | | " | " | **** | 1387 | 0.0 |
| 37 | " | " | H: 0.02 | 2.6 | " | " | " | | " | " | **** | 1201 | 0.1 |
| 38 | 0.010 | " | None | 2.8 | " | " | " | | " | " | **** | 1320 | 0.0 |
| 39 | " | " | None | " | V(P) | 60 | " | | " | " | **** | 515 | 0.1 |
| 40 | 0.005 | 6.0 | None | 3.0 | V(N) | 85 | " | | " | " | **** | 1300 | 0.0 |
| 41 | " | 3.0 | None | " | " | " | " | | " | " | **** | 1296 | " |
| 42 | " | " | None | " | V(P) | " | " | | " | " | **** | 538 | " |
| 43 | " | 1.0 | None | " | V(N) | " | " | | " | " | **** | 1268 | " |
| 44 | " | 0.5 | None | " | " | " | " | | " | " | **** | 1200 | " |
| 45 | " | 0.3 | None | " | " | " | " | | " | " | **** | 1211 | " |
| 46 | " | 3.0 | I: 0.005 | 3.6 | " | 80 | " | | " | " | **** | 1311 | " |

TABLE 1-continued

| Example No. of Present Invention | Composition of cleaning solution | | | | Cleaning conditions | | | | Surface condition*3) | | Contaminants after cleaning | | Number of adhered fine particles per squ. centimeter*6) |
|---|---|---|---|---|---|---|---|---|---|---|---|---|---|
| | HF wt. % | H$_2$O$_2$ wt. % | Other additives*1) mol/liter | pH | Cleaned wafer*2) | Temperature °C. | Time (min.) | | Before | After | AAS*4) | Life time*5) | |
| 47 | 0.010 | " | I: 0.005, M: 0.0047 | 4.7 | " | " | " | | " | " | **** | 1369 | " |
| 48 | 0.200 | 3.0 | None | 1.9 | V(N) | 60 | 5 | | Hydrophilic | Hydrophobic | **** | 1304 | >170 |
| 49 | 0.080 | 1.0 | None | 2.2 | " | 80 | 8 | | " | " | **** | 1320 | " |
| 50 | 0.020 | 21.0 | None | 2.6 | " | " | 5 | | " | Hydrophilic | **** | 1366 | 0.0 |
| 51 | " | 0.1 | None | " | " | " | " | | " | Hydrophobic | **** | 1300 | 83 |
| 52 | " | 0.05 | None | " | " | " | " | | " | " | **** | 1344 | 107 |
| 53 | 0.001 | 3.0 | None | 3.5 | " | " | " | | " | Hydrophilic | **** | 437 | 3.5 |
| 54 | None | " | F: 1.0 | 0.0 | " | 70 | " | | " | " | **** | 1225 | >170 |
| 55 | None | " | F: 1.0 | " | V(P) | " | " | | " | " | **** | 510 | " |
| 56 | None | " | F: 0.16 | 0.8 | V(N) | 80 | 10 | | " | " | **** | 1136 | " |
| 57 | None | " | F: 0.16 | " | V(P) | " | 10 | | " | " | **** | 533 | " |
| 58 | 0.50 | 0.15 | None | 1.5 | V(N) | 30 | 5 | | " | Hydrophobic | **** | 1324 | 23 |
| 59 | " | 1.0 | None | " | " | " | " | | " | " | **** | 1347 | 18 |
| 60 | 0.25 | " | None | 1.8 | " | " | " | | " | " | **** | 1310 | 8.6 |
| 61 | 0.010 | 3.0 | None | 0.0 | " | 80 | " | | " | Hydrophilic | **** | 1241 | >170 |
| 62 | 0.010 | " | C: 1.0, Comp. Ex. too low pH M: 0.6047, A: 0.4000 | 7.0 | " | 60 | " | | " | " | **** | 302 | 0.8 |

*1)Chemicals are abbreviated as follows: For example, "A: 0.10" means that a chemical A was added in an amount of 0.10 mol/liter.
A: phosphoric acid, B: sulfuric acid, C: nitric acid, D: trichloroacetic acid, E: dichloroacetic acid, F: hydrochloric acid, G: monochloroacetic acid,
H: acetic acid, I: ammonium fluoride, J: ammonium chloride, K: ammonium nitrate, L: choline chloride, M: ammonia, N: choline.
*2)Abbreviation of wafers to be cleaned are as follows:
For silicon semiconductor wafers, marks indicated in parentheses represent the type of conductivity, i.e., "P" represents p-type semiconductor, and "N" does n-type semiconductor.
V: silicon semiconductor wafers having a thin oxide film cleaned by the SC-1 cleaning,
W: hydrophobic silicon semiconductor wafers having no oxide film before cleaning,
X: silicon semiconductor wafers having a thick oxide film of a thickness of about 250 Angstroms,
Y: quartz glass wafers.
*3)"Hydrophilic" means hydrophilic surface, while "Hydrophobic" does hydrophobic surface.
*4)AAS represents a quantitative value determined by atomic absorption spectrometry in terms of 10$^{10}$ atoms/cm$^2$. The lower limit of the quantitative value is 8 × 10$^9$ atoms/cm$^2$, and ND means lower than the lower limit.
*5)Life time is the recombination carrier life time determined by a photoconductive decay method (μ-PCD method) in terms of μsec.
*6)The number of fine particles adhered having a diameter more than 0.3 μmφ measured by a light scattering method (an instrument of measuring fine particles).
*7)The wafers were examined by the naked eye to count the number of fine particles adhered (Examination under the illumination from a condenser).

As described above, the use of the cleaning solution of the present invention enables removal of metal contaminants, a reduction in the adhesion of fine particles, and no loss of hydrophilic property of the surfaces to be achieved by cleaning in the course of production of semiconductor devices, semiconductor wafers and glass wafers, so that the present invention contributes progress of the industry.

What is claimed is:

1. A solution for cleaning silicon semiconductors and silicon oxides comprising an aqueous acidic solution containing 0.005% by weight or more to less than 0.05% by weight hydrogen fluoride and 0.3% by weight or more to 20.0% by weight or less hydrogen peroxide and having a pH in the range at least 1 to less than 5.

2. The solution according to claim 1, wherein said aqueous acidic solution contains at least one selected from acids, salts and bases in addition to said hydrogen fluoride and said hydrogen peroxide.

3. The solution according to claim 2, wherein said acid is selected from the group consisting of phosphoric acid, sulfuric acid, nitric acid, trichloroacetic acid, dichloroacetic acid, hydrochloric acid, monochloroacetic acid and acetic acid, and said salt is selected from the group consisting of ammonium salts and amine salts, and the base is selected from the group consisting of ammonia and amines.

* * * * *